(12) United States Patent
Choi et al.

(10) Patent No.: US 9,761,519 B2
(45) Date of Patent: Sep. 12, 2017

(54) PACKAGE SUBSTRATE AND SEMICONDUCTOR PACKAGE INCLUDING THE SAME

(71) Applicant: Samsung Electronics Co., Ltd., Suwon-si, Gyeonggi-do (KR)

(72) Inventors: Jae-hoon Choi, Cheonan-si (KR); Chang-yong Park, Cheonan-si (KR); Dong-woo Shin, Cheonan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/155,008

(22) Filed: May 14, 2016

(65) Prior Publication Data

US 2016/0372412 A1    Dec. 22, 2016

(30) Foreign Application Priority Data

Jun. 16, 2015  (KR) .......................... 10-2015-0085146

(51) Int. Cl.
| | |
|---|---|
| *H01L 23/12* | (2006.01) |
| *H01L 23/48* | (2006.01) |
| *H01L 23/02* | (2006.01) |
| *H01L 23/498* | (2006.01) |

(52) U.S. Cl.
CPC .. *H01L 23/49838* (2013.01); *H01L 23/49811* (2013.01); *H01L 23/49827* (2013.01); *H01L 2224/16* (2013.01); *H01L 2924/181* (2013.01)

(58) Field of Classification Search
CPC ......... H01L 23/49838; H01L 23/49811; H01L 23/49827

USPC ................ 257/668, 690, E21.597, E21.599; 438/667; 174/257

See application file for complete search history.

(56) References Cited

U.S. PATENT DOCUMENTS

| | | | |
|---|---|---|---|
| 6,448,504 B1 | 9/2002 | Taguchi | |
| 6,492,714 B1 * | 12/2002 | Kasatani | ............... H01L 25/105 257/666 |
| 6,958,527 B2 * | 10/2005 | Hanaoka | ........... H01L 23/49816 174/255 |
| 6,987,323 B2 * | 1/2006 | Yamane | .............. H01L 23/3114 257/690 |
| 8,258,617 B2 | 9/2012 | Shibuya | |
| 8,507,805 B2 * | 8/2013 | Fujii | ..................... H01L 21/561 174/256 |
| 8,592,968 B2 | 11/2013 | Shibuya | |
| 2007/0045836 A1 | 3/2007 | Kwon et al. | |
| 2007/0103269 A1 | 5/2007 | Han et al. | |
| 2008/0026559 A1 | 1/2008 | Miyazaki | |

(Continued)

FOREIGN PATENT DOCUMENTS

| | | |
|---|---|---|
| JP | 2001320155 | 11/2001 |
| JP | 5290215 B2 | 9/2013 |

(Continued)

*Primary Examiner* — Dao H Nguyen
(74) *Attorney, Agent, or Firm* — Renaissance IP Law Group LLP

(57) ABSTRACT

A package substrate includes: a body layer; and a pattern layer formed on a surface of the body layer. The pattern layer includes: a wire pattern; a solder pad connected to the wire pattern; and a through hole adjacent to a boundary between the wire pattern and the solder pad and vertically penetrating the pattern layer. A semiconductor package and an electronic device are disclosed.

18 Claims, 20 Drawing Sheets

(56) References Cited

U.S. PATENT DOCUMENTS

| | | | |
|---|---|---|---|
| 2009/0283303 A1* | 11/2009 | Chang | H05K 1/116 |
| | | | 174/257 |
| 2010/0164101 A1 | 7/2010 | Lee et al. | |
| 2014/0334108 A1* | 11/2014 | Jung | H05K 3/3452 |
| | | | 361/728 |
| 2016/0268546 A1* | 9/2016 | Lee | H01L 51/5253 |

FOREIGN PATENT DOCUMENTS

| | | |
|---|---|---|
| JP | 2013258347 | 12/2013 |
| KR | 20060077478 | 7/2006 |
| KR | 20100079389 A | 7/2010 |

\* cited by examiner

PACKAGE SUBSTRATE AND SEMICONDUCTOR PACKAGE INCLUDING THE SAME

CROSS-REFERENCE TO RELATED APPLICATION

This application claims the benefit of Korean Patent Application No. 10-2015-0085146, filed on Jun. 16, 2015, in the Korean Intellectual Property Office, the disclosure of which is incorporated herein in its entirety by reference.

BACKGROUND

The inventive concept relates to a package substrate in which a through hole is formed in a pattern layer to prevent crack propagation, and a semiconductor package including the package substrate.

As electronic devices become small and portable, a user frequently drops the electronic devices and thus, the electronic devices get broken. As a result, electric connection in the electronic devices may be cut due to the impact when the electronic devices are dropped, and thus, research into improving reliability of the electronic devices has been actively conducted.

SUMMARY

In one embodiment, the inventive concept provides a package substrate configured to prevent a short circuit in a wire pattern.

In another embodiment, the inventive concept provides a semiconductor package including a package substrate configured to prevent a short circuit in a wire pattern and an electronic system.

In yet another embodiment, according to an aspect of the inventive concept, there is provided a package substrate including: a body layer; and a pattern layer formed on a surface of the body layer. The pattern layer includes: a wire pattern; a solder pad connected to the wire pattern; and a through hole adjacent to a boundary between the wire pattern and the solder pad and vertically penetrating the pattern layer.

A distance between a center of the through hole and a central point of the boundary may be equal to or less than 50% of a length of the boundary.

A horizontal cross-section of the through hole may be circular shaped.

A horizontal cross-section of the through hole may be oval shaped having a short axis and a long axis, and the long axis may be perpendicular to the boundary.

The short axis may be parallel to the boundary, and a length of the short axis may range from about 25% to about 50% of the length of the boundary.

The through hole may include a first through hole and a second through hole which are spaced apart from each other.

A center of each of the first through hole and the second through hole may be placed on the boundary.

A center of the first through hole may be spaced apart from a center of the second through hole with respect to the boundary.

The wire pattern may extend having a predetermined width, but in a region where the wire pattern is adjacent to the boundary, a width of the wire pattern may increase as the wire pattern gets closer to the boundary.

The wire pattern may extend having a first width, but extend having a second width greater than the first width in a region where the wire pattern is adjacent to the boundary.

The package substrate may further include a protection layer that covers at least a portion of an upper surface of the body layer and at least a portion of the pattern layer.

The protection layer may expose a central portion of an upper surface of the solder pad to the outside and cover a region adjacent to an edge of the solder pad.

The other portions of the solder pad except for the portion of the solder pad which is adjacent to the boundary may be exposed to the outside.

The protection layer may expose an entire upper surface of the solder pad.

The body layer may include a fabric and a fabric reinforcement. The fabric may include at least one of glass fiber and aramid resin. The fabric reinforcement may include at least one of polycyclic aromatic epoxy resin, bisphenol-group epoxy resin, naphthalene-group epoxy resin, o-cresol novolac epoxy resin, dicyeclopentadiene epoxy resin, biphenyl-group epoxy resin and phenol novolac epoxy resin.

According to another embodiment, there is provided a semiconductor package including: a package substrate including a pattern layer formed on a surface of the package substrate; a semiconductor chip mounted on the package substrate; and a connection member electrically connecting the semiconductor chip and the package substrate. The pattern layer includes a wire pattern, a solder pad connected to an end of the wire pattern, and a through hole that is adjacent to a boundary between the wire pattern and the solder pad and vertically penetrates the pattern layer.

The connection member may be formed of solders.

In yet another embodiment, a system for dissipation of mechanical shock in an electronic device is provided. The system includes at least one circuit board disposed in the electronic device for operating the electronic device, the at least one circuit board comprising a pattern layer comprising at least one through hole through the at least one circuit board, each of the at least one through hole disposed in a location configured to provide the dissipation of the mechanical shock.

The at least one through hole may be disposed through the pattern layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
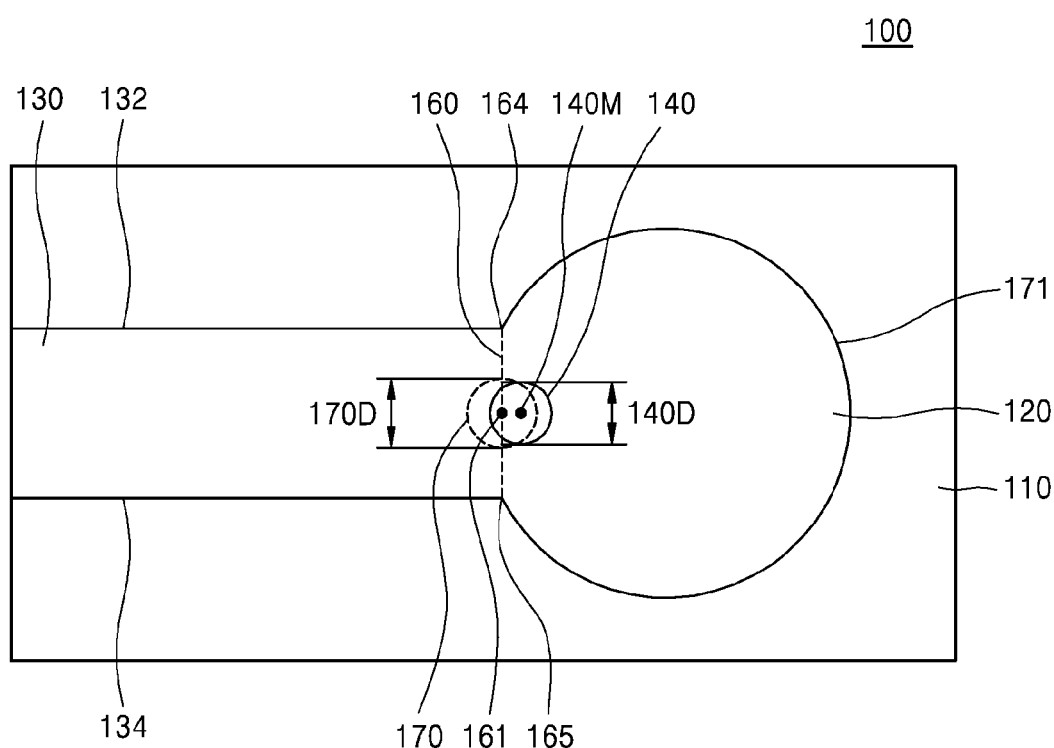
FIG. 1 illustrates a plan view of a package substrate according to an exemplary embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art. Like reference numerals in the drawings denote like elements. Furthermore, components and areas in the drawings are schematically illustrated, and thus, the concept of the inventive concept is not limited to relative sizes and distances illustrated in the drawings.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this inventive concept.

The terms used in the present specification are merely used to describe particular embodiments, and are not intended to limit the subject matter disclosed herein. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. As used herein, the term "exemplary" generally refers to one of many possible embodiments, and is not meant to imply a superior or superlative embodiment (although the embodiment may be such for a particular application).

Unless otherwise defined, all terms (including technical and scientific terms) used herein have the same meaning as commonly understood by one of ordinary skill in the art to in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
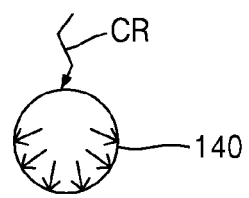
FIG. 2 schematically illustrates stress distributed in a through hole.

FIG. 1 illustrates a plan view of a package substrate 100 according to an exemplary embodiment of the inventive concept, and FIG. 2 schematically illustrates stress distributed in a through hole 140 formed in the package substrate 100 shown in FIG. 1.

Referring to FIG. 1, the package substrate 100 includes a body layer 110 and at least one pattern layer. Each pattern layer includes a wire pattern 130 and a solder pad 120 and may have through hole 140 formed around a boundary between the wire pattern 130 and the solder pad 120. In FIG. 1, an illustrative portion of the package substrate 100 is illustrated in the drawings, thus, one solder pad 120 is illustrated. It should be recognized that the pattern layers may include a plurality of features, some of which are merely introduced herein.

The package substrate 100 may be, for example, a Printed Circuit Board (PCB). The PCB may be a single-sided PCB or a double-sided PCB and may be a multi-layer PCB including one or more internal wires inside the package substrate 100. Furthermore, the PCB may be a rigid PCB or a flexible PCB.

The body layer 110 may be formed of "prepreg" that is formed by inserting non-hardened resin such as epoxy resin, polyamide resin, bismaleimide-group resin, and phenol-group resin into organic fibers such as a glass fiber and aramid resin. Other suitable fibers or combinations of fibers may be used. An additional type of suited fiber is carbon-based or carbon fiber. The fibers often take the form of a weave and the non-hardened resin matrix is used to bond them together and to other components during manufacture. The matrix is only partially cured to allow easy handling. As discussed herein, the term "prepreg" generally refers to fabric reinforcement that has been pre-impregnated with a resin system. The resin system may be an epoxy that includes a proper curing agent. As a result, the prepreg is ready to lay into a mold without the addition of resin or the steps required of a typical hand lay-up.

The wire pattern 130 may be formed on one side surface or both side surfaces of the body layer 110. The wire pattern 130 extends in a direction and exhibits a predetermined width. The wire pattern 130 may be formed of a material having high electric conductivity, for example, copper (Cu).

The solder pad 120 may be placed on one end of the wire pattern 130, and the solder pad 120 and the wire pattern 130 may be integrally formed. The solder pad 120 may have a circular arc having a predetermined curvature or may have circular arcs having curvatures varying at edges of the solder pad 120. The solder pad 120 may be formed of a material having high electric conductivity, for example, Cu.

The solder pad 120 and the wire pattern 130 may be integrally formed. For example, the solder pad 120 and the wire pattern 130 may be integrally formed by forming a thin film of photoresist material on a surface of the body layer 110, transferring a mask pattern to the thin film of photoresist material by irradiating light onto the thin film of photoresist material, and dissolving an exposed portion of the photoresist material in a developer.

The through hole 140 may be formed in an area where the through hole 140 is adjacent to the boundary 160 between the solder pad 120 and the wire pattern 130. The through hole 140 is spaced apart from a first outline 132 and a second outline 134 of the wire pattern 130 and is placed within the wire pattern 130 and the solder pad 120. The through hole 140 is formed to vertically penetrate a surface of each of the pattern layers that include the solder pad 120 and wire pattern 130 and another surface that is opposite to the surface of each of the solder pad 120 and wire pattern 130. That is, the through hole 140 vertically penetrates a portion of the wire pattern 130 and/or a portion of the solder pad 120. A shape of a horizontal cross-section of the through hole 140 that is cut to be parallel to a surface of the package substrate 100 may be a circle having a constant diameter or an oval, or of another suitable geometry.

In the drawings, there is one through hole 140 illustrated, but there may be a plurality of through holes 140, and the through holes 140 may not overlap each other. The through holes 140 may be spaced apart from each other at regular intervals. Any arrangement deemed appropriate for a particular implementation may be used.

In some exemplary embodiments, circular arc 171 is described by a start point of a line from a portion where a first outline 132 of the wire pattern 130 starts extending toward the solder pad 120 to a portion where a curve having a curvature that is not equal to zero (0) starts is defined as a first point 164, and a start point of a line from a portion where a second outline 134 of the wire pattern 130 starts extending toward the solder pad 120 to a portion where a curve having a curvature that is not equal to zero (0) starts is defined as a second point 165. A boundary 160 is defined as a segment connecting the first point 164 and the second point 165.

A center 140M of the through hole 140 may be positioned within a virtual circle 170. The virtual circle 170 includes a center that is a central point 161 of the boundary 160, and a diameter 170D of the virtual circle 170 may be about 50% of a length of the boundary 160. In other words, a distance from the center 140M of the through hole 140 and the central point 161 of the boundary 160 may be equal to or less than about 50% of the length of the boundary 160.

When impact is applied to an electronic device, stress may be concentrated on both ends of the boundary 160 between the pattern 130 and the solder pad 120. That is, the stress may be concentrated at the first point 164 and/or the second point 165, and accordingly, cracks may start from the first point 164 and/or the second point 165 and may propagate toward a center of the wire pattern 130. In some instances, he through hole 140 will prevent the cracks starting from the first point 164 or the second point 165 from propagating and thus prevent a short circuit of the wire pattern 130 due to the cracks.

A diameter 140D of the through hole 140 may range from about 25% to about 50% of the length of the boundary 160.

In the drawings, it is illustrated that the center 140M of the through hole 140 is placed to be separate from the boundary 160 toward the solder pad 120, but the center 140M of the through hole 140 may be placed on the boundary 160 or may be placed to be separate from the boundary 160 toward the wire pattern 130.

Referring to FIGS. 1 and 2, when the through hole 140 has the circular-shaped horizontal cross-section, and when a crack CR propagating from the first point 164 or the second point 165 reaches the through hole 140, stress is distributed so that the crack CR is prevented from propagating beyond the through hole 140. In an exemplary embodiment, the shape of the horizontal cross-section of the through hole 140 may be a circle having a constant diameter, and thus the stress may be evenly distributed within the through hole 140.

Figure 3:
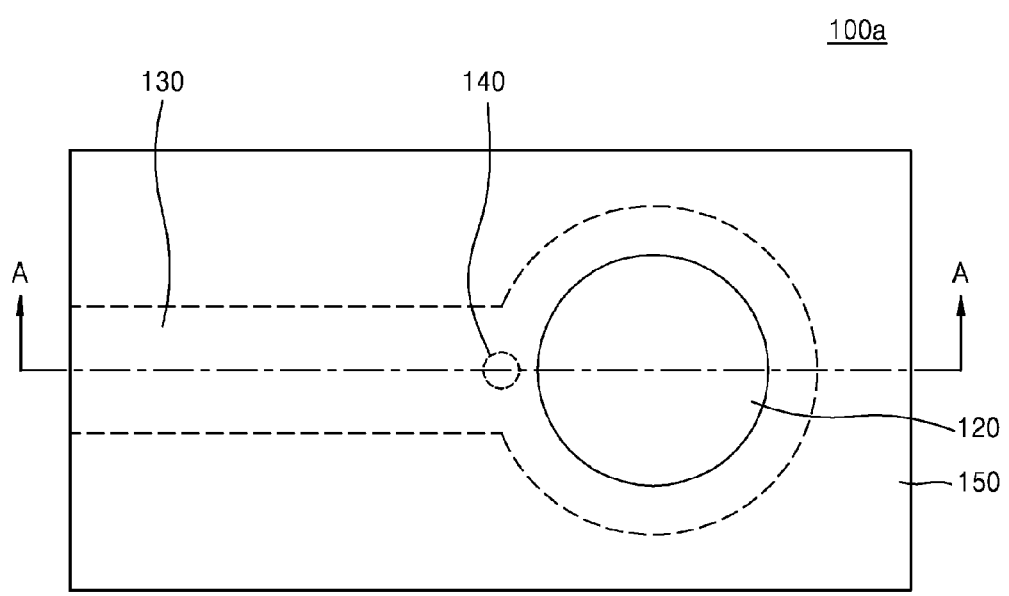
FIG. 3 illustrates a plan view of a package substrate according to an exemplary embodiment of the inventive concept.
Figure 4:
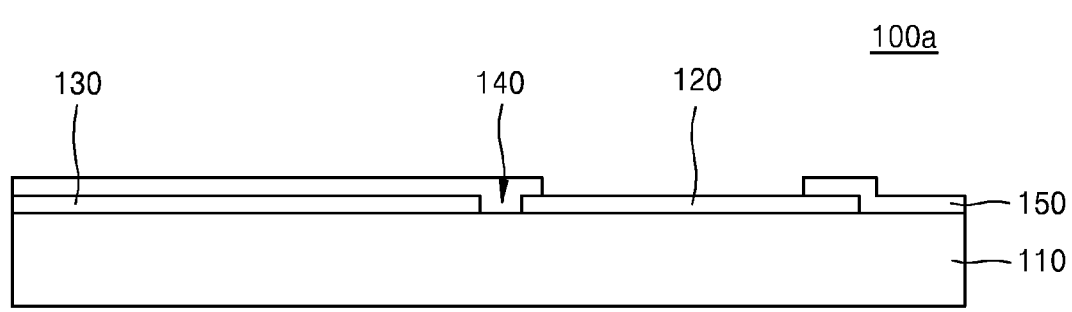
FIG. 4 illustrates a cross-sectional view taken along a line A-A of FIG. 3.

FIG. 3 illustrates a plan view of a package substrate 100a according to an exemplary embodiment of the inventive concept, and FIG. 4 illustrates a cross-sectional view taken along a line A-A of FIG. 3.

Referring to FIGS. 3 and 4, the package substrate 100a may include the body layer 110, the pattern layers, and a protection layer 150. In this example, the pattern layers include the wire pattern 130 and the solder pad 120 and may have the through hole 140 formed to be adjacent to the boundary between the wire pattern 130 and the solder pad 120.

The protection layer 150 may be formed above and/or under the package substrate 100a. The protection layer 150 may cover edges of the solder pad 120, portions of an upper surface of the solder pad 120 adjacent to the edges thereof, an upper surface of the body layer 110, and the wire pattern 130 and may prevent the covered edges of the solder pad 120, upper portion of the solder pad 120, upper surface of the body layer 110, and wire pattern 130 from being oxidized or contaminated. The protection layer 150 may be formed of, for example, solder resist.

The protection layer 150 may be formed on a surface of the package substrate 100a. In an exemplary embodiment, the protection layer 150 may cover a region adjacent to the edges of the solder pad 120 except a central portion of the upper surface of the solder pad 120. That is, the protection layer 150 may be formed to partially expose the central portion of solder pad 120 and may cover edges of the wire pattern 130 and the solder pad 120 to protect the same. A connection member may be connected to the central portion of the solder pad 120 that is partially exposed.

The protection layer 150 may prevent exfoliation of the solder pad 120. Also, the protection layer 150 may reduce the stress applied to the boundary 160.

Figure 5:
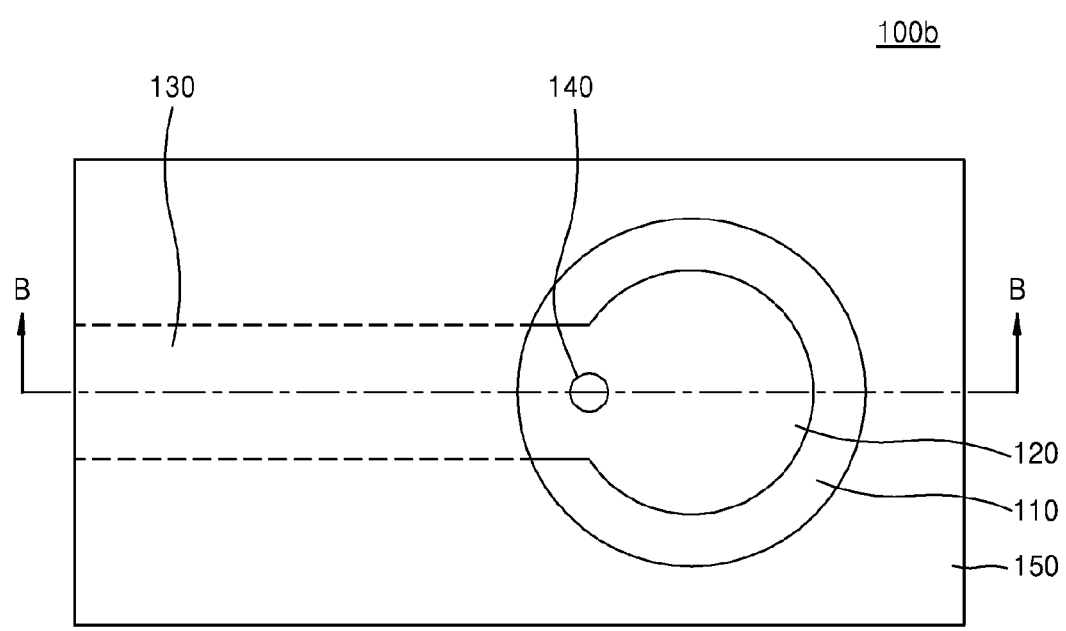
FIG. 5 illustrates a plan view of a package substrate according to an exemplary embodiment of the inventive concept.
Figure 6:
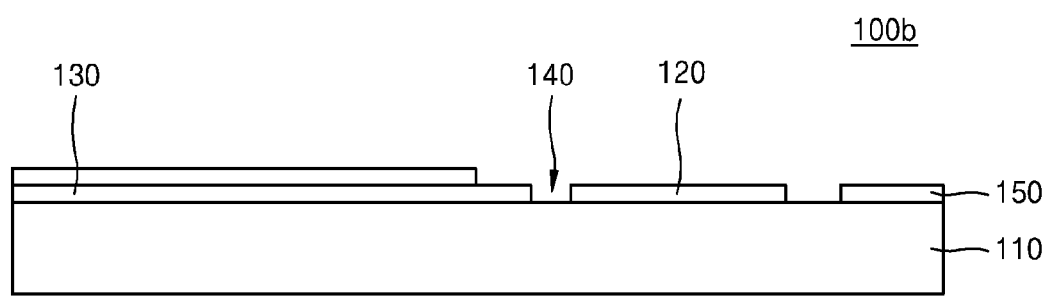
FIG. 6 illustrates a cross-sectional view taken along a line B-B of FIG. 5.

FIG. 5 illustrates a plan view of a package substrate 100b according to an exemplary embodiment of the inventive concept, and FIG. 6 illustrates a cross-sectional view taken along a line B-B of FIG. 5.

Referring to FIGS. 5 and 6, the package substrate 100b may include the body layer 110, the pattern layers, and the protection layer 150. The pattern layers include the wire pattern 130 and the solder pad 120 and may have the through hole 140 formed to be adjacent to the boundary between the wire pattern 130 and the solder pad 120.

In an exemplary embodiment, the protection layer 150 may cover portions excluding an entire upper surface of the solder pad 120 and a portion of the wire pattern 130 that is adjacent to the solder pad 120. That is, on a surface of the package substrate 100b, the protection layer 150 may be formed to expose the solder pad 120 and the portion of the wire pattern 130 that is adjacent to the solder pad 120. A connection member may be connected to the solder pad 120 and the portion of the wire pattern 130 which are exposed to the outside.

Since the protection layer 150 is formed to expose the entire upper surface of the solder pad 120 to the outside, an area where the connection member is connected to the solder pad 120 may increase. Therefore, connection reliability of the connection member may be improved.

Figure 7A:
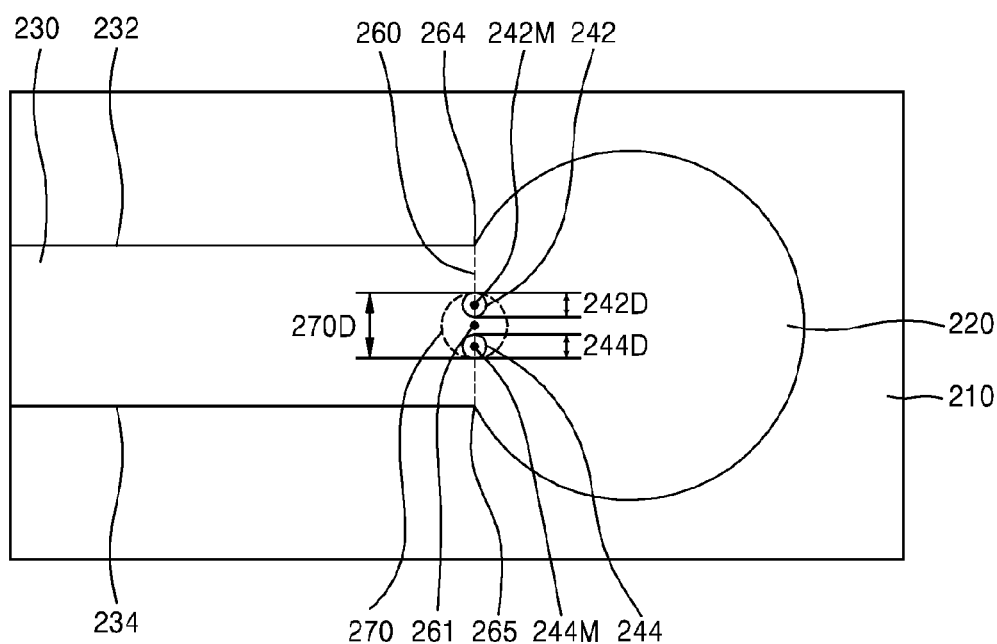
FIGS. 7A and 7B illustrate plan views of package substrates according to an exemplary embodiment of the inventive concept.
Figure 7B:
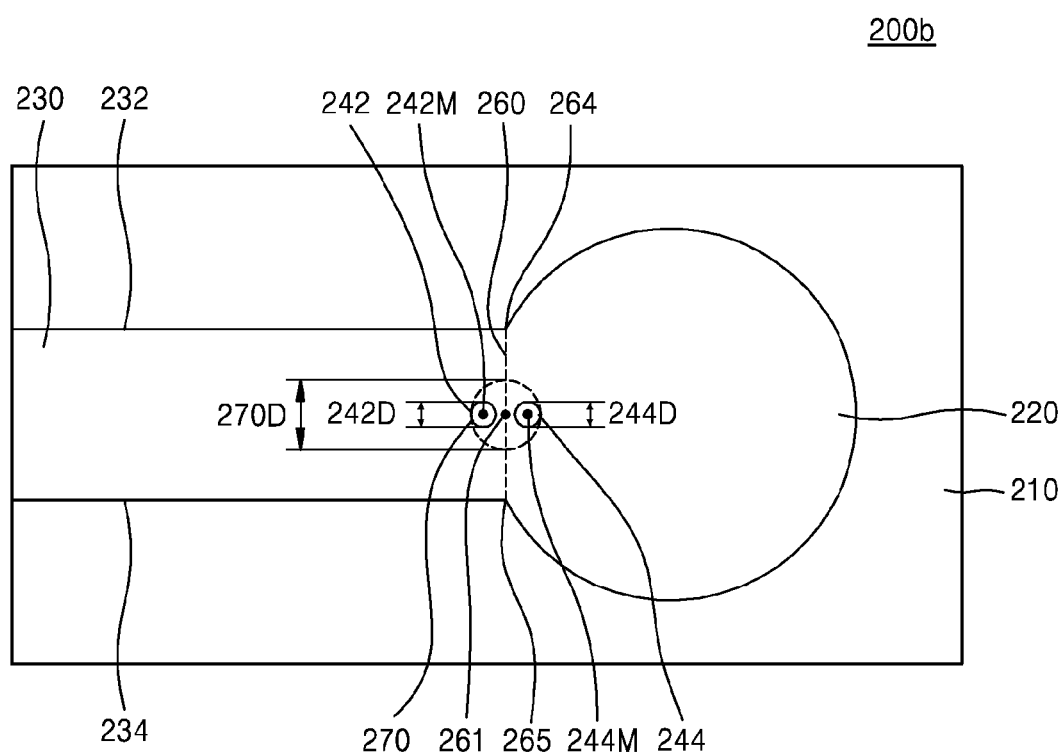

FIGS. 7A and 7B illustrate plan views of package substrates 200a and 200b according to an exemplary embodiment of the inventive concept.

Referring to FIGS. 7A and 7B, the package substrate 200a may include a body layer 210 and pattern layers. The pattern layers include a wire pattern 230 and a solder pad 220 and may have through holes 242 and 244 formed to be adjacent to a boundary between the wire pattern 230 and the solder pad 220. Cross-sections of the through holes 242 and 244 that are cut to be parallel to the package substrate 200a are circular shaped, and the through holes 242 and 244 may be a first through hole 242 and a second through hole 244.

The body layer 210, the wire pattern 230, and the solder pad 220 are substantially the same as the body layer 110, the wire pattern 130, and the solder pad 120 described with reference to FIG. 1, and thus descriptions thereof will be omitted.

Referring to FIG. 7A, the through holes 242 and 244 may be the first through hole 242 and the second through hole 244, and the first through hole 242 and the second through hole 244 may be spaced apart from each other. A center 242M of the first through hole 242 and a center 244M of the second through hole 244 may be placed within a virtual circle 270. The virtual circle 270 may be a circle having a center that is a central point 261 of the boundary 260, and a diameter 270D of the virtual circle 270 may be about 50% of a length of the boundary 260. That is, a distance between the center 242M of the first through hole 242 and the central point 261 of the boundary 260 and a distance between the center 244M of the second through hole 244 and the central point 261 of the boundary 260 may each be equal to or less than 50% of the length of the boundary 260.

In an exemplary embodiment, the center 242M of the first through hole 242 and the center 244M of the second through hole 244 may be placed on the boundary 260. When cracks appear and propagate from both ends of the boundary 260, that is, a first point 264 and a second point 265, and when a crack that propagates from the first point 264 reaches the first through hole 242 that is adjacent to the first point 264, stress is distributed, and thus, the crack may not further propagate. At the same time, when a crack that propagates from the second point 265 reaches the second through hole 244 that is adjacent to the second point 265, stress is distributed, and thus, the crack may not further propagate. Therefore, although the cracks propagate from the first point 264 and the second point 265, a crack may not appear between the first through hole 242 and the second through hole 244, and thus a short circuit of the wire pattern 230 may be prevented.

A diameter 242D of the first through hole 242 may be the same as or different from a diameter 244D of the second through hole 244.

A sum of the diameter 242D of the first through hole 242 and the diameter 244D of the second through hole 244 may range from about 25% to about 50% of the length of the boundary 260.

In the drawings, the first and second through holes 242 and 244 are illustrated, but there may be a plurality of through holes. In this case, the through holes may be spaced apart from each other at regular intervals. Also, the package substrate 200a may include the protection layer 150 illustrated in FIGS. 3 and 5.

Referring to FIG. 7B, the through holes 242 and 244 may be the first through hole 242 and the second through hole 244, and the first through hole 242 and the second through hole 244 may be spaced apart from each other. The center 242M of the first through hole 242 and the center 244M of the second through hole 244 may be placed inside the virtual circle 270. The virtual circle 270 is a circle having the central point 261 of the boundary 260 as a center of the virtual circle 270, and the diameter 270D of the virtual circle 270 may be about 50% of the length of the boundary 260. That is, a distance between the center 242M of the first through hole 242 and the central point 261 of the boundary 260 and a distance between the center 244M of the second through hole 244 and the central point 261 of the boundary 260 may be equal to or less than about 50% of the length of the boundary 260.

In an exemplary embodiment, the center 242M of the first through hole 242 may be placed at a line from the boundary 260 to the solder pad 220, and the line is inside the virtual circle 270, and the center 244M of the second through hole 244 may be placed at a line from the boundary 260 toward the wire pattern 230, and the line is inside the virtual circle 270. That is, the center 242M of the first through hole 242 and the center 244M of the second through hole 244 may be spaced apart from each other with respect to the boundary 260. As the first through hole 242 and the second through hole 244 are spaced apart from each other with respect to the boundary 260, a region where the cracks starting from the first point 264 and/or the second point 265 reach the first and second through holes 242 and 244 may increase. Therefore, crack propagation may be prevented in a wider region.

The diameter 242D of the first through hole 242 may be the same as or different from the diameter 244D of the second through hole 244.

A sum of the diameter 242D of the first through hole 242 and the diameter 244D of the second through hole 244 may range from about 25% to about 50% of the length of the boundary 260.

The first and second through holes 242 and 244 are illustrated in the drawings, but there may be a plurality of through holes. In this case, the through holes may be spaced apart from each other at regular intervals. Also, the package substrate 200b may include the protection layer 150 illustrated in FIGS. 3 and 5.

Figure 8:
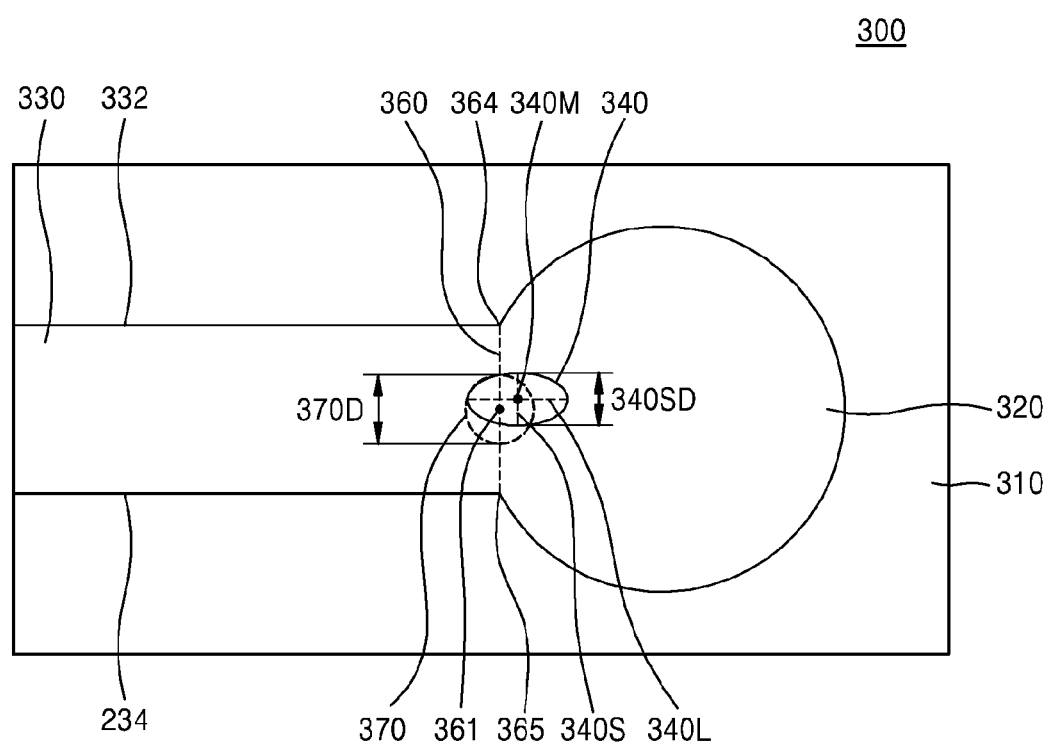
FIG. 8 illustrates a plan view of a package substrate according to an exemplary embodiment of the inventive concept.
Figure 9:
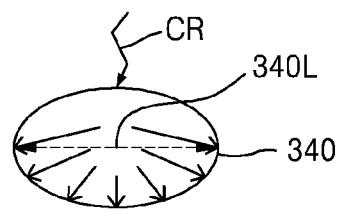
FIG. 9 schematically illustrates stress distributed in a through hole.

FIG. 8 illustrates a plan view of a package substrate 300 according to an exemplary embodiment of the inventive concept, and FIG. 9 schematically illustrates stress distributed in a through hole.

Referring to FIG. 8, the package substrate 300 may include a body layer 310 and pattern layers. The pattern layers include a wire pattern 330 and a solder pad 320 and may have a through hole 340 formed to be adjacent to a boundary between the wire pattern 330 and the solder pad 320. A cross-section of the through hole 340 that is cut to be parallel to the package substrate 300 is oval shaped.

The body layer 310, the wire pattern 330, and the solder pad 320 are substantially the same as the body layer 110, the wire pattern 130, and the solder pad 120 described with reference to FIG. 1, and thus descriptions thereof will be omitted.

Referring to FIG. 8, a shape of the through hole 340 is an oval having a long axis 340L and a short axis 340S that vertically cross each other. The long axis 340L may be substantially perpendicular to the boundary 360, and the short axis 340S may be substantially parallel to the boundary 360. The through hole 340 has a center 340M at a portion where the long axis 340L crosses the short axis 340S.

In an exemplary embodiment, a horizontal cross-section of the through hole 340 may be oval shaped, and the center 340M of the through hole 340 may be placed within a virtual circle 370. The virtual circle 370 is a circle having a center that is a central point 361 of the boundary 360, and a diameter 370D of the virtual circle 370 may be about 50% of a length of the boundary 360. In other words, a distance between the center 340M of the through hole 340 and the central point 361 of the boundary 360 may be about 50% of the length of the boundary 360.

A length 340SD of the short axis 340S of the through hole 340 may range from about 25% to about 50% of the length of the boundary 360.

In the drawings, the center 340M of the through hole 340 is placed to be separate from the boundary 360 toward the solder pad 320, but the center 340M of the through hole 340 may be placed on the boundary 360 or may be placed to be separate from the boundary 360 toward the wire pattern 330.

Referring to FIGS. 8 and 9, the through hole 340 may prevent a crack CR starting from the first point 364 or the second point 365 from propagating. Stress applied to a portion of the through hole 340 is distributed within the through hole 340, and in this case, the stress may be concentrated on an end portion of the long axis 340L and distributed.

Accordingly, as the stress is distributed within the through hole 340, the crack CR may not further propagate, or a direction in which the crack CR propagates may change to a lengthwise direction of the long axis 340L, and thus a short circuit of the wire pattern 330 may be prevented.

Figure 10A:
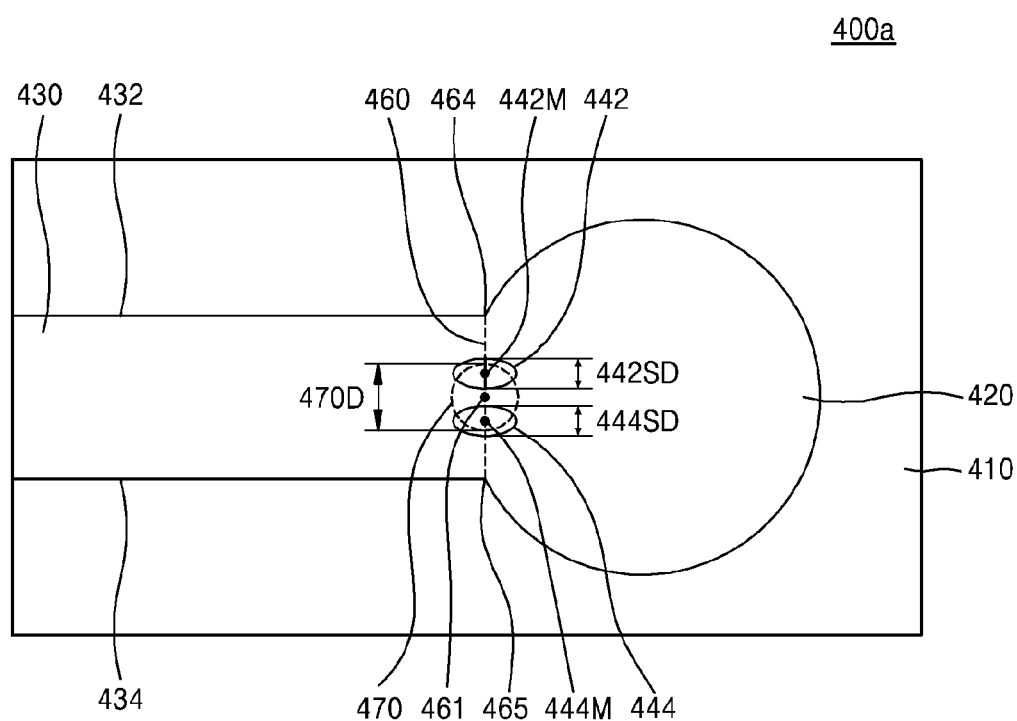
FIGS. 10A and 10B illustrate plan views of package substrates according to an exemplary embodiment of the inventive concept.
Figure 10B:
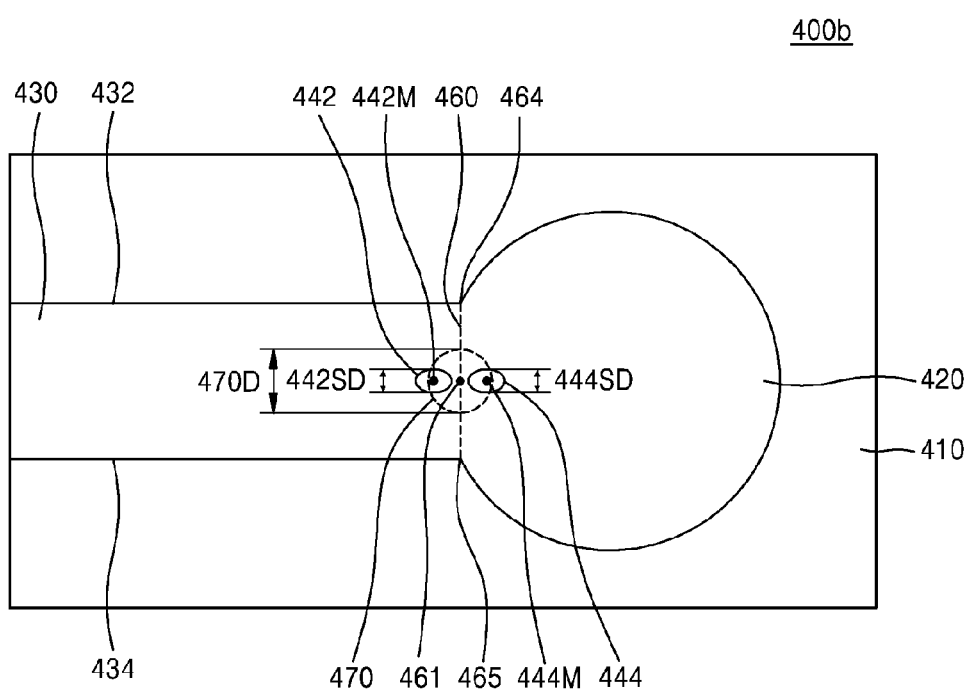

FIGS. 10A and 10B illustrate plan views of package substrates 400a and 400b according to an exemplary embodiment of the inventive concept.

Referring to FIGS. 10A and 10B, package substrates 400a and 400b may include a body layer 410 and pattern layers. The pattern layers include a wire pattern 430 and a solder pad 420 and may have through holes 442 and 444 formed to be adjacent to a boundary between the wire pattern 430 and the solder pad 420. Cross-sections of the through holes 442 and 444 that are cut to be parallel to the package substrates 400a and 400b are oval shaped, and the through holes 442 and 444 may be a first through hole 442 and a second through hole 444.

The body layer 410, the wire pattern 430, and the solder pad 420 are substantially the same as the body layer 110, the wire pattern 130, and the solder pad 120 described with reference to FIG. 1, and thus descriptions thereof will be omitted.

Referring to FIG. 10A, the first through hole 442 and the second through hole 444 may be spaced apart from each other. A center 442M of the first through hole 442 and a center 444M of the second through hole 444 may be placed within a virtual circle 470. The virtual circle 470 may be a circle having a center that is a central point 461 of the boundary 460, and a diameter 470D of the virtual circle 470 may be about 50% of a length of the boundary 460.

In an exemplary embodiment, the center 442M of the first through hole 442 and the center 444M of the second through hole 444 may be placed on the boundary 460. When cracks appear and propagate from both ends of the boundary 460, that is, a first point 464 and a second point 465, and when a crack that propagates from the first point 464 reaches the first through hole 442 that is adjacent to the first point 464, stress is distributed, and in this case, the stress may be concentrated on and distributed at both ends of a long axis of the first through hole 442. Accordingly, the stress is distributed within the first through hole 442 so that the crack may not further propagate or a direction in which the crack propagates may change. Likewise, when a crack that propagates from the second point 465 reaches the second through hole 444 that is adjacent to the second point 465, stress is distributed, and in this case, the stress may be concentrated on and distributed at both ends of a long axis of the second through hole 444. Accordingly, the stress is distributed within the second through hole 444 so that the crack may not further propagate or a direction in which the crack propagates may change. Therefore, although the cracks propagate from the first point 464 and the second point 465, a crack may not appear between the first through hole 442 and the second through hole 444, and thus a short circuit of the wire pattern 430 may be prevented.

A length 442SD of a short axis of the first through hole 442 may be the same as or different from a length 444SD of a short axis of the second through hole 444.

A sum of the length 442SD of the short axis of the first through hole 442 and the length 444SD of the short axis of the second through hole 444 may range from about 25% to about 50% of the length of the boundary 460.

In the drawings, the first and second through holes 442 and 444 are illustrated, but there may be a plurality of through holes. In this case, the through holes may be spaced apart from each other at regular intervals.

Referring to FIG. 10B, the first through hole 442 and the second through hole 444 may be spaced apart from each other. The center 442M of the first through hole 442 and the center 444M of the second through hole 444 may be placed inside the virtual circle 470. The virtual circle 470 is a circle having the central point 461 of the boundary 460 as a center of the virtual circle 470, and the diameter 470D of the virtual circle 470 may be about 50% of the length of the boundary 460.

In an exemplary embodiment, the center 442M of the first through hole 442 may be placed at a line from the boundary 460 to the solder pad 420, and the line is inside the virtual circle 470, and the center 444M of the second through hole 444 may be placed at a line from the boundary 460 toward the wire pattern 430, and the line is inside the virtual circle 470. That is, the center 442M of the first through hole 442 and the center 444M of the second through hole 444 may be spaced apart from each other with respect to the boundary 460. As the first through hole 442 and the second through hole 444 are arranged with respect to the boundary 460, cracks staring from the first point 464 and/or the second point 465 may reach the first through hole 442 and the second through hole 444 in a wider area.

Also, as the stress is distributed within the first through hole 442 or the second through hole 444, the cracks may not further propagate. Also, the stress may be concentrated in a lengthwise direction of the long axis of the first through hole 442 or the second through hole 444, and thus, a direction of cracks may change to the lengthwise direction of the long axis of the first through hole 442 or the second through hole 444.

The length 442SD of the short axis of the first through hole 442 may be the same as or different from the length 444SD of the short axis of the second through hole 444.

The sum of the length 442SD of the short axis of the first through hole 442 and the length 444SD of the short axis of the second through hole 444 may range from about 25% to about 50% of the length of the boundary 460.

In the drawings, the first through hole 442 or the second through hole 444 are illustrated, but there may be a plurality of through holes. In this case, the through holes may be spaced apart from each other at regular intervals.

Figure 11:
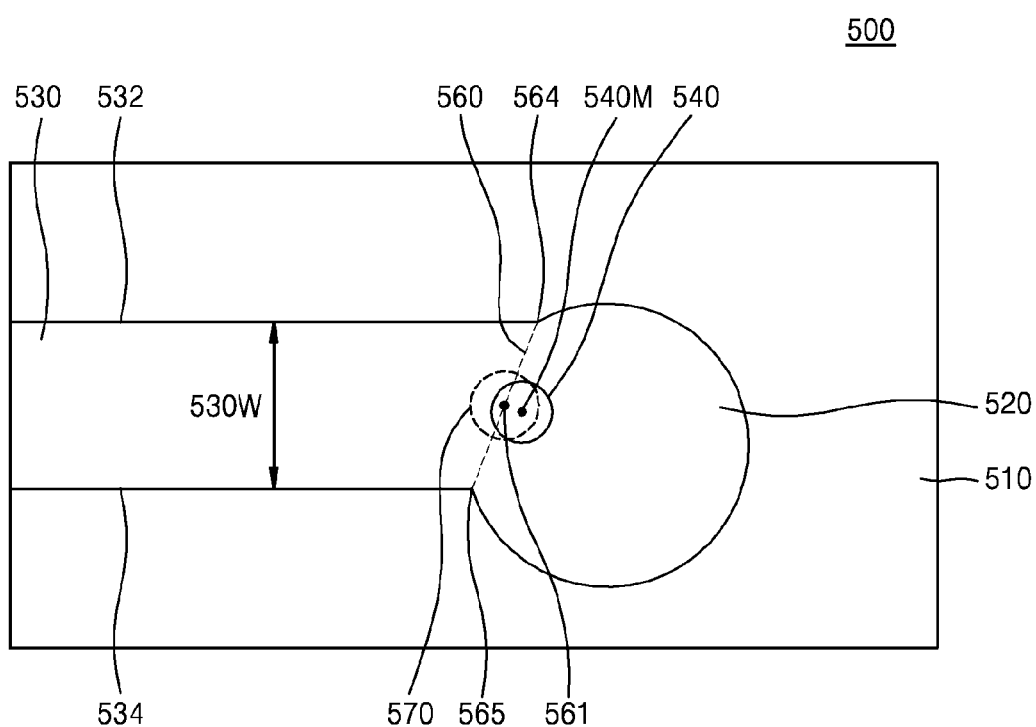
FIG. 11 illustrates a plan view of a package substrate according to an exemplary embodiment of the inventive concept.

FIG. 11 illustrates a plan view of a package substrate 500 according to an exemplary embodiment of the inventive concept.

Referring to FIG. 11, the package substrate 500 may include a body layer 510 and pattern layers. The pattern layers include a wire pattern 530 and a solder pad 520 and may have a through hole 540 formed to be adjacent to a boundary 560 between the wire pattern 530 and the solder pad 520.

The body layer 510, the solder pad 520, and the through hole 540 are substantially the same as the body layer 110, the solder pad 120, and the through hole 140 described with reference to FIG. 1, and thus descriptions thereof will be omitted.

In some exemplary embodiments, the wire pattern 530 extends having a predetermined width, and a length of the boundary 560 between the wire pattern 530 and the solder pad 520 may be greater than a width 530W of the wire pattern 530. For example, a length of a vertical line from a second point 564 to a first outline 532 may be smaller than the length of the boundary 560.

Figure 12A:
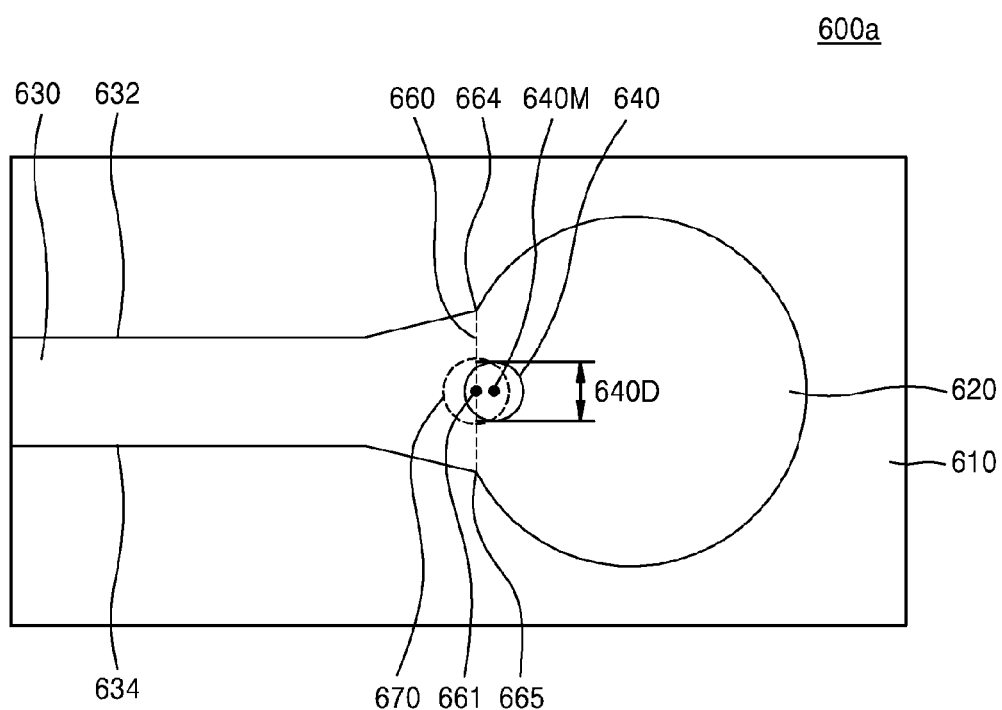
FIGS. 12A and 12B illustrate plan views of package substrates according to an exemplary embodiment of the inventive concept.
Figure 12B:
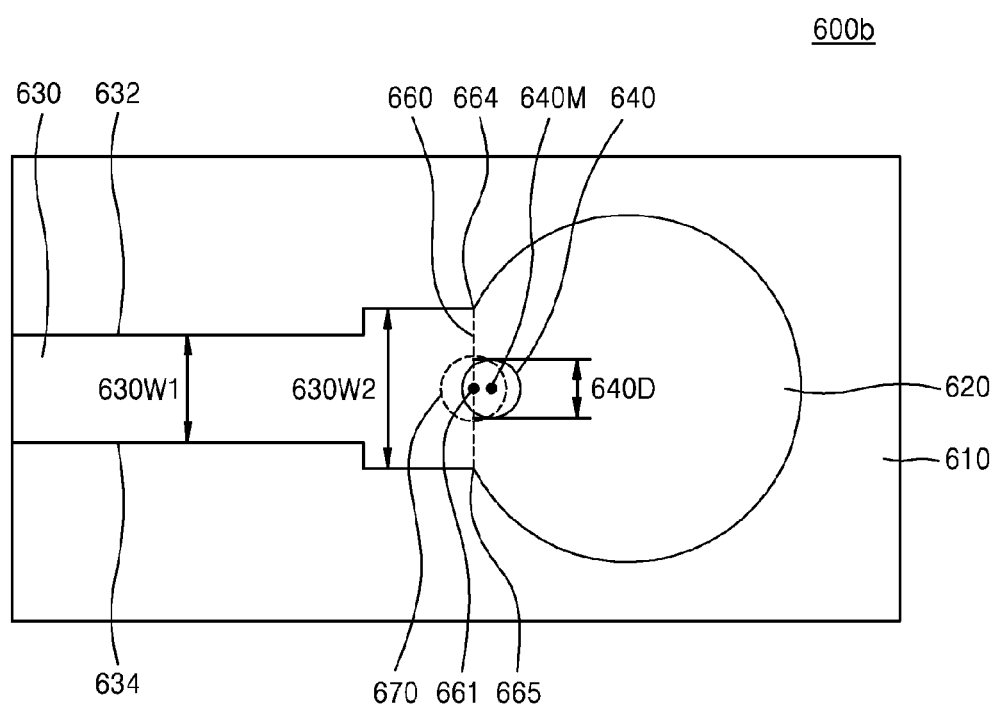

FIGS. 12A and 12B illustrate plan views of package substrates 600a and 600b according to an exemplary embodiment of the inventive concept.

Referring to FIGS. 12A and 12B, the package substrates 600a and 600b may include a body layer 610 and pattern layers. The pattern layers include a wire pattern 630 and a solder pad 620 and may have a through hole 640 formed to be adjacent to a boundary between the wire pattern 630 and the solder pad 620.

The body layer 610, the solder pad 620, and the through hole 640 are substantially the same as the body layer 110, the solder pad 120, and the through hole 140 described with reference to FIG. 1, and thus descriptions thereof will be omitted.

Referring to FIG. 12A, in some exemplary embodiments, in a region where the wire pattern 630 is adjacent to the boundary 660, a width of the wire pattern 630 may increase toward the boundary 660. That is, the wire pattern 630 extends having substantially the same width, but the width of the wire pattern 630 may increase in a region where the wire pattern 630 is adjacent to the solder pad 620.

As the width of the wire pattern 630 increases in the region where the wire pattern 630 is adjacent to the solder pad 620, a crack starting from a first point 664 or a second point 665 may delay a time taken to cause a short circuit of the wire pattern 630, and also, a region where the through hole 640 may be formed may increase. Thus, design degrees of freedom may be increased. Furthermore, since a diameter 640D of the through hole 640 may increase even when the wire pattern 630 extends having a fine line width, an area where the stress may be distributed increases and thus, the crack propagation may be effectively prevented.

Referring to FIG. 12B, in some exemplary embodiments, in the region where the wire pattern 630 is adjacent to the boundary 660, the width of the wire pattern 630 may be greater than in other regions. That is, the wire pattern 630 extends having a first width 630W1, but in the region where wire pattern 630 is adjacent to the solder pad 620, the wire pattern 630 may have a second width 630W2 greater than the first width 630W1. Each of the first width 630W1 and the second width 630W2 may have a constant length.

As the wire pattern 630 has the second width 630W2 greater than the first width 630W1 in the region where the wire pattern 630 is connected to the solder pad 620, a propagation time of cracks staring from both ends of the boundary 660 may be delayed. Also, an area where the through hole 640 may be formed may increase, and thus, a freedom degree of a design may be improved. Furthermore, since the diameter 640D of the through hole 640 may increase even when the wire pattern 630 extends having a fine line width, an area where the stress may be distributed increases whereby the crack propagation may be effectively prevented.

Figure 13:
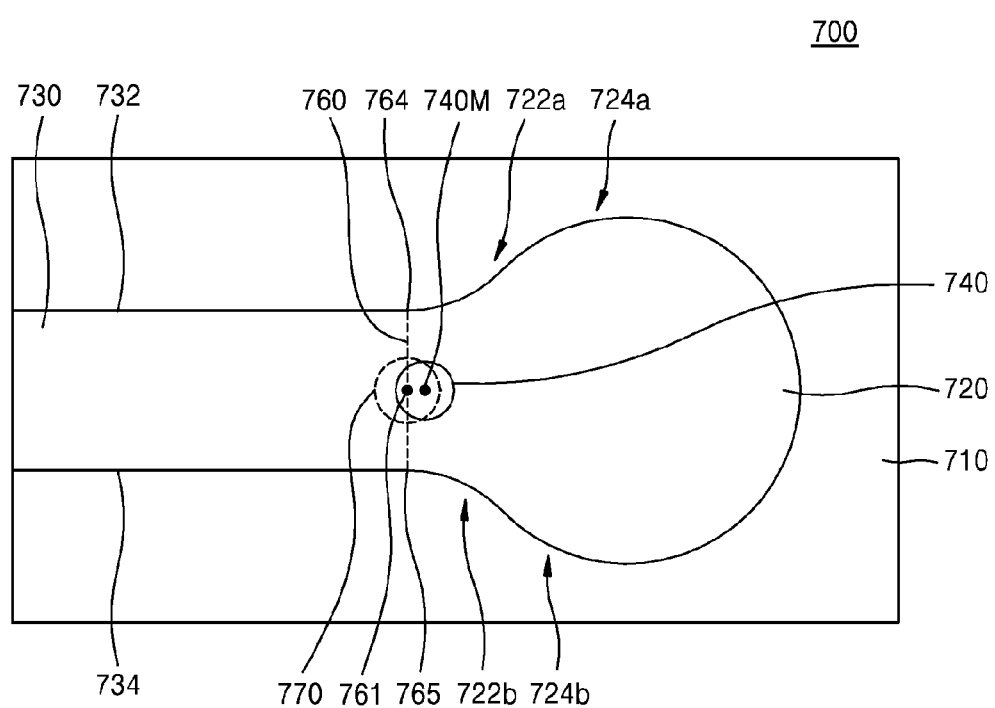
FIG. 13 illustrates a plan view of a package substrate according to an exemplary embodiment of the inventive concept.

FIG. 13 illustrates a plan view of a package substrate 700 according to an exemplary embodiment of the inventive concept.

Referring to FIG. 13, the package substrate 700 may include a body layer 710 and pattern layers. The pattern layers include a wire pattern 730 and a solder pad 720 and may have a through hole 740 formed to be adjacent to a boundary 760 between the wire pattern 730 and the solder pad 720.

Each of the body layer 710, the wire pattern 730, and the through hole 740 may have similar or the same structure as the body layer 110, the wire pattern 130, and the through hole 140 described with reference to FIG. 1, and thus descriptions thereof will be omitted.

As an exemplary embodiment, the solder pad 720 may include a circular arc having curvatures varying at edges of the solder pad 720. For example, a circular arc starting from a first point 764 may include a first concave portion 722a adjacent to the first point 764 and a first convex portion 724a adjacent to the first concave portion 722a. Also, a circular arc starting from a second point 765 may include a second concave portion 722b adjacent to the second point 765 and a second convex portion 724b adjacent to the second concave portion 722b.

Here, it will be understood that when a portion is adjacent to another portion, the portion may be directly connected to the other portion or an intervening portion may be present therebetween. Also, a concave portion of a circular arc means that, when two arbitrary points of a portion are connected by a straight line, if the straight line exists outside the solder pad 720, the portion is defined as being concave. On the other hand, a convex portion of a circular arc means that, when two arbitrary points of a portion are connected by a straight line, if the straight line exists inside the solder pad 720, the portion is defined as being convex.

The solder pad 720 includes a concave portion in an area where the wire pattern 730 and the solder pad 720 are connected to each other, thereby preventing a stress from being excessively concentrated on a portion.

Figure 14:
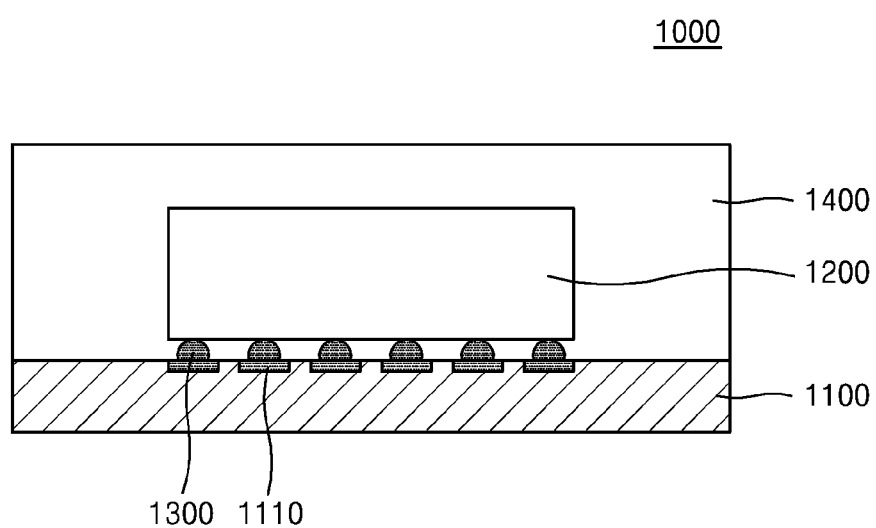
FIG. 14 illustrates a plan view of a semiconductor package according to an exemplary embodiment of the inventive concept.

FIG. 14 illustrates a plan view of a semiconductor package 1000 according to an exemplary embodiment of the inventive concept.

Referring to FIG. 14, the semiconductor package 1000 may include a package substrate 1100, a semiconductor chip 1200 mounted on a surface of the package substrate 100, connection members 1300, and a molding member 1400. The package substrate 1100 may include the package substrate 100, 100a, 100b, 200a, 200b, 300, 400a, 400b, 500, 600a, 600b, and 700 described with reference to FIGS. 1 to 13.

The semiconductor chip 1200 may be mounted on one surface of the package substrate 1100 and may be electrically connected to the package substrate 1100 via the connection members 1300 arranged between the package substrate 1100 and the semiconductor chip 1200. In some exemplary embodiments, the semiconductor chip 1200 may be a semiconductor chip for performing various functions, for example, a memory device, a logic device (e.g., a microprocessor, an analog device, a digital signal processor, etc.), or a system on chip. The memory device may include, for example, dynamic random access memory (DRAM), static random access memory (SRAM), flash memory, electrically erasable programmable read-only memory (EEPROM), phase change RAM (PRAM), magnetic RAM (MRAM), resistive RAM (RRAM), or the like.

The semiconductor chip 1200 may be a multi-chip having a stack structure in which at least two semiconductor chips are stacked. For example, the at least two semiconductor chips may be the same type of memory devices, or one of the at least two semiconductor chips may be a memory device, and the other of the at least two semiconductor chips may be a microcontroller device.

The connection member 1300 is formed above a solder pad 1110 and may electrically connect the semiconductor chip 1200 to the package substrate 1100. The connection member 1300 may be formed of a conductive material such as Cu, aluminum (Al), a solder, silver (Ag), tin (Sn), or gold (Au). For example, the connection member 1300 may be a solder ball, a solder bump, or a wire formed by a wire bonding device.

Since a pattern layer formed on a surface of the package substrate 1100 includes a through hole vertically penetrating the pattern layer in an area where the pattern layer is adjacent to the solder pad 1110, a frequency of occurrence of a short circuit of the pattern layer that is caused by an external impact may be reduced.

The molding member 1400 may surround the semiconductor chip 1200 on the package substrate 1100. The molding member 1400 may include epoxy-group molding resin, polyimide-group molding resin, or the like.

The epoxy-group molding resin may be, for example, polycyclic aromatic epoxy resin, bisphenol-group epoxy resin, naphthalene-group epoxy resin, o-cresol novolac epoxy resin, dicyeclopentadiene epoxy resin, biphenyl-group epoxy resin, phenol novolac epoxy resin, or the like. In other exemplary embodiments, the molding resin may further include carbon black that is a coloring agent. The molding resin may further include a hardener, a hardening accelerator, a filler, a flame retardant, etc. other than the carbon black that is the coloring agent.

Figure 15:
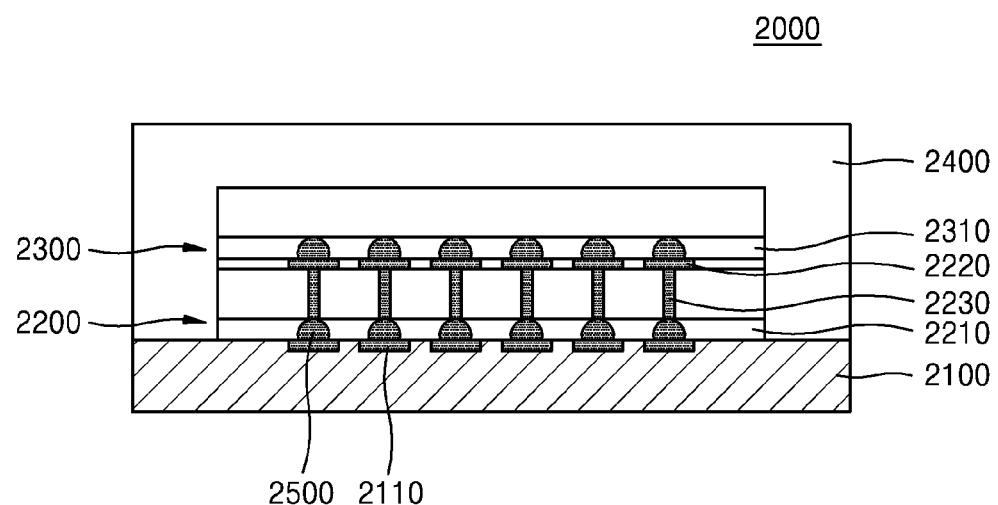
FIG. 15 illustrates a plan view of a semiconductor package according to an exemplary embodiment of the inventive concept.

FIG. 15 illustrates a plan view of a semiconductor package 2000 according to an exemplary embodiment of the inventive concept.

Referring to FIG. 15, the semiconductor package 2000 may include a package substrate 2100, a first semiconductor chip 2200 formed above the package substrate 2100, a second semiconductor chip 2300, a molding member 2400, and the like. The package substrate 2100 may include the package substrate 100, 100*a*, 100*b*, 200*a*, 200*b*, 300, 400*a*, 400*b*, 500, 600*a*, 600*b*, and 700 described with reference to FIGS. 1 to 13.

The first semiconductor chip 2200 includes through silicon vias (TSV) 2230, and the TSV 2230 may be electrically connected to an upper pad 2220 formed of a conductive material on an upper surface of the first semiconductor chip 2200. Although not illustrated, a lower pad formed of a conductive material on a lower surface of the first semiconductor chip 2200 may electrically connect the TSV 2230 to connection members 2500.

The first and second semiconductor chips 2200 and 2300 may function as memory devices or logic device. For example, the memory device may include DRAM, SRAM, flash memory, EEPROM, PRAM, MRAM, RRAM, or the like. The first and second semiconductor chips 2200 and 2300 may be the same memory device, or one of the first and second semiconductor chips 2200 and 2300 may be a memory device, and the other of the first and second semiconductor chips 2200 and 2300 may be a logic device.

In the present exemplary embodiment, the first and second semiconductor chips 2200 and 2300 have a stack structure. The stack structure is merely illustrative and is not limiting of the teachings herein. Semiconductor chips may be additionally stacked in the first and second semiconductor chips 2200 and 2300.

The connection member 2500 is formed on a solder pad 2110 and electrically connects the package substrate 2100 to the first semiconductor chip 2200. Also, the connection member 2500 may be formed on the upper pad 2220 and may electrically connect the first semiconductor chip 2200 to the second semiconductor chip 2300. The connection member 2500 may be formed of a conductive material such as Cu, Al, a solder, Ag, Sn, or Au.

Since a pattern layer formed on a surface of the package substrate 2100 includes a through hole vertically penetrating the pattern layer in an area where the pattern layer is adjacent to the solder pad 2110, a frequency of occurrence of a short circuit of the pattern layer that is caused by external impact may be reduced.

A first gap filling member 2210 and a second gap filling member 2310 fill gaps between the package substrate 2100 and the first and second semiconductor chips 2200 and 2300, and thus a binding force of the package substrate 2100 and the first and second semiconductor chips 2200 and 2300 may be strengthened. The first gap filling member 2210 and the second gap filling member 2310 may be formed of, for example, molding resin.

The molding member 2400 may surround an upper surface of the package substrate 2100 and the first and second semiconductor chips 2200 and 2300 and may protect the first and second semiconductor chips 2200 and 2300. The molding member 2400 may be formed of, for example, a silicon-group material, a thermosetting material, a thermoplastic material, a UV processing material, or the like.

Figure 16:
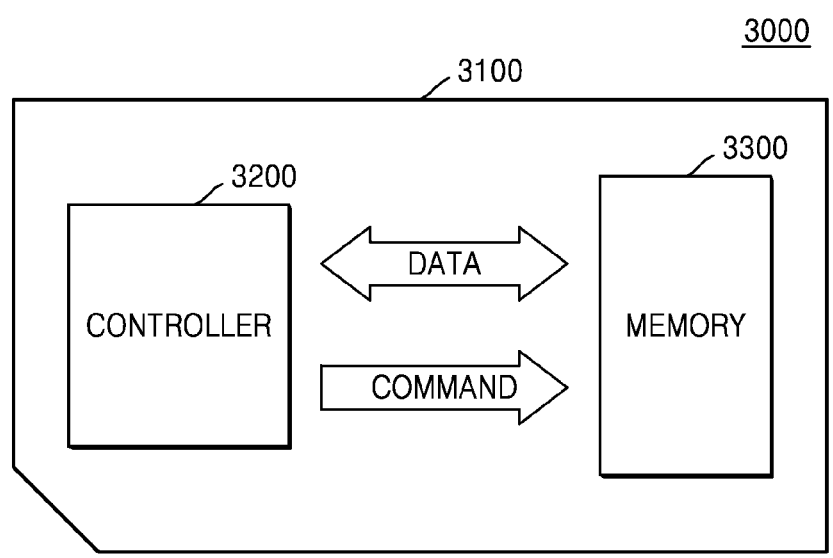
FIG. 16 illustrates a schematic block diagram of a memory system including a semiconductor memory device according to one or more exemplary embodiments of the inventive concept.

FIG. 16 illustrates a schematic block diagram of a memory system 3000 including a semiconductor memory device according to one or more exemplary embodiments of the inventive concept.

Referring to FIG. 16, the memory system 3000 may be a semiconductor storage device. For example, the memory system 3000 may be a memory card or a solid state drive (SSD). The memory system 3000 may include a controller 3200 and a memory 3300 within a housing 3100. The controller 3200 and the memory 3300 may exchange electrical signals with each other. For example, the controller 3200 and the memory 3300 may exchange data with each other according to commands of the controller 3200. Accordingly, the memory system 3000 may store data in the memory 3300 or may output data read from the memory 3300 to the outside. The controller 3200 and/or the memory 3300 may include the semiconductor packages according to one or more exemplary embodiments of the inventive concept.

Figure 17:
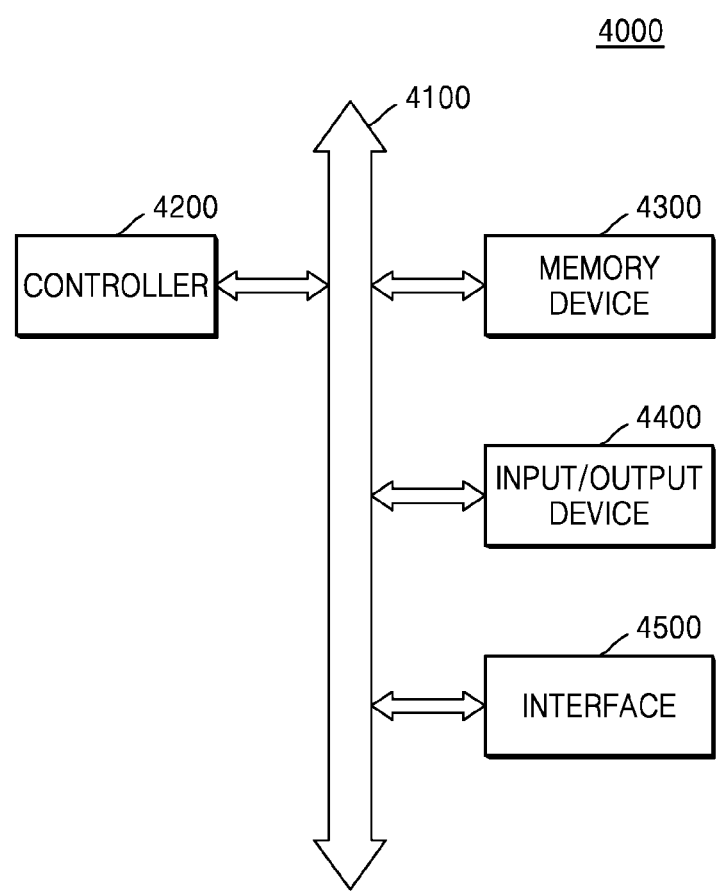
FIG. 17 illustrates a block diagram of an electronic system including a semiconductor memory device according to one or more exemplary embodiments of the inventive concept.

FIG. 17 illustrates a block diagram of an electronic system 4000 including a semiconductor memory device according to one or more exemplary embodiments of the inventive concept.

Referring to FIG. 17, the electronic system 4000 may include a controller 4200, a memory device 4300, and an input/output device 4400. The controller 4200, the memory device 4300, and the input/output device 4400 may be combined via a bus 4100. The bus 4100 may be a path via which data is exchanged. For example, the controller 4200 may include at least one of at least one microprocessor, a digital signal processor, a micro controller, and logic devices performing the same functions as the at least one microprocessor, the digital signal processor, and the micro controller. The input/output device 4400 may include at least one selected from a keypad, a keyboard, a display device, and the like. The memory device 4300 stores data. The memory device 4300 may store data, commands executed by the controller 4200, and/or the like. The memory device 4300 may include a volatile memory device and/or a non-volatile memory device. The memory device 4300 may be flash memory. The flash memory may be an SSD. In this case, the electronic system 4000 may stably store a large amount of data in the memory device 4300. The controller 4200 and memory device 4300 may include the semiconductor packages according to one or more exemplary embodiments of the inventive concept. The electronic system 4000 may further include an interface 4500 for receiving/transmitting data from/to a communication network. The interface 4500 may operate in a wired or wireless manner For example, the interface 4500 may include an antenna or a wired or wireless transceiver.

It should be recognized that use of the permissive term "may" as used herein with regard to distribution of stress, is not meant to imply that it is unknown whether the teachings herein are effective. Rather, stress may be distributed in some instances, while not in others, as a result of or in consideration of the direction, magnitude and duration of the applied stress as well as other factors such as the actual design.

Thus, there is disclosed herein a stress relieving system for mitigating or eliminating the adverse consequence of mechanical shock imparted to an electronic device disposed on a substrate. The mechanical shock may arise from, for example, accidental droppage of the electronic device and be dissipated by strategic placement of at least one through hole. The strategic placement provides for interruption of stress waves that result from the mechanical shock.

While the inventive concept has been particularly shown and described with reference to exemplary embodiments thereof, it will be understood that various changes in form and details may be made therein without departing from the spirit and scope of the following claims.

What is claimed is:

1. A package substrate comprising:
a body layer; and
a pattern layer formed on a surface of the body layer, wherein the pattern layer comprises:
a wire pattern;
a solder pad connected to the wire pattern; and
a plurality of through holes, each through hole disposed on a boundary between the wire pattern and the solder pad, vertically penetrating both the wire pattern and the solder pad of the pattern layer.

2. The package substrate of claim 1, wherein a distance between a center of one of the through holes and a central point of the boundary is equal to or less than 50% of a length of the boundary.

3. The package substrate of claim 2, wherein a horizontal cross-section of the one of the through holes is circular shaped.

4. The package substrate of claim 2, wherein a horizontal cross-section of the one of the through holes is oval shaped having a short axis and a long axis, and
the long axis is perpendicular to the boundary.

5. The package substrate of claim 4, wherein the short axis is parallel to the boundary, and
a length of the short axis ranges from about 25% to about 50% of the length of the boundary.

6. The package substrate of claim 1, wherein the through holes comprise a first through hole and a second through hole, a center of the first through hole and a center of the second through hole are disposed on the boundary.

7. The package substrate of claim 1, wherein the through holes comprise a first through hole and a second through hole, and a center of the first through hole is spaced apart from a center of the second through hole with respect to the boundary.

8. The package substrate of claim 1, wherein the wire pattern extends having a predetermined width, but in a region where the wire pattern is adjacent to the boundary, a width of the wire pattern increases as the wire pattern gets closer to the boundary.

9. The package substrate of claim 1, wherein the wire pattern extends having a first width, but extends having a second width greater than the first width in a region where the wire pattern is adjacent to the boundary.

10. The package substrate of claim 1, further comprising a protection layer that covers at least a portion of an upper surface of the body layer and at least a portion of the pattern layer.

11. The package substrate of claim 10, wherein the protection layer exposes a central portion of an upper surface of the solder pad to the outside and covers a region adjacent to an edge of the solder pad.

12. The package substrate of claim 10, wherein the protection layer exposes an entire upper surface of the solder pad.

13. A semiconductor package comprising:
a package substrate comprising a pattern layer formed on a surface of the package substrate;
a semiconductor chip mounted on the package substrate; and
a connection member electrically connecting the semiconductor chip and the package substrate,
wherein the pattern layer comprises a wire pattern, a solder pad connected to an end of the wire pattern, and a plurality of through holes, each through hole disposed on a boundary between the wire pattern and the solder pad, vertically penetrating the wire pattern and the solder pad of the pattern layer.

14. The semiconductor package of claim 13, wherein the connection member is formed of solders.

15. The semiconductor package of claim 13, wherein a horizontal cross-section of one of the through holes is a circle having a constant diameter.

16. The semiconductor package of claim 13, wherein the through holes are spaced apart from each other at regular intervals.

17. A system for dissipation of mechanical shock in an electronic device, the system comprising:
at least one circuit board disposed in the electronic device for operating the electronic device, the at least one circuit board comprising a pattern layer comprising:
a first point defined by a first line of an outline of the pattern layer and a first curve of the outline; and
a second point defined by a second line of the outline and a second curve of the outline:
a plurality of through holes penetrating through the pattern layer, each of the through holes disposed on a third line extending from the first point to the second point.

18. The electronic device as in claim 17, wherein the pattern layer comprises a wire pattern and a solder pad connected to the wire pattern, wherein the third line is a boundary between the wire pattern and the solder pad.

\* \* \* \* \*